United States Patent
Evans et al.

(10) Patent No.: US 6,524,645 B1
(45) Date of Patent: Feb. 25, 2003

(54) PROCESS FOR THE ELECTROLESS DEPOSITION OF METAL ON A SUBSTRATE

(75) Inventors: Michael D. Evans, Wilmington, MA (US); Tae Yong Kim, Boxford, MA (US); Henry Hon Law, Berkeley Heights, NJ (US); Te-Sung Wu, New Providence, NJ (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 08/324,842

(22) Filed: Oct. 18, 1994

(51) Int. Cl.[7] .................................................. B05D 5/12
(52) U.S. Cl. .................. 427/126.2; 427/223; 427/304; 427/314; 427/437; 427/443.1
(58) Field of Search ............................ 427/58, 96, 97, 427/98, 223, 304, 305, 314, 126.2, 443.1, 443.2, 437; 106/1.11

(56) References Cited

U.S. PATENT DOCUMENTS

| | | | | |
|---|---|---|---|---|
| 4,189,700 A | * | 2/1980 | Hill | 338/333 |
| 4,510,179 A | * | 4/1985 | Honjo et al. | 427/96 |
| 4,666,078 A | * | 5/1987 | Ohno | 228/124 |
| 4,685,030 A | * | 8/1987 | Reyes et al. | 361/400 |
| 4,748,086 A | * | 5/1988 | Akoh | 428/433 |
| 4,865,877 A | * | 9/1989 | Yamaguchi et al. | 427/98 |
| 5,219,292 A | * | 6/1993 | Dickirson et al. | 439/67 |
| 5,288,313 A | * | 2/1994 | Portner | 106/1.11 |

FOREIGN PATENT DOCUMENTS

| | | | | |
|---|---|---|---|---|
| EP | 1304387 | 8/1970 | | C23C/3/02 |
| EP | A2 273 227 | 12/1987 | | H05K/3/38 |

OTHER PUBLICATIONS

"Manufacture of Ceramic Circuit Board", by Yukihisa, H, et al., *Patent Abstracts of Japan*, vol. 16, No. 554 and JP 04 209591 A (Hitachi Chemical Co.) Jul. 30, 1992.

* cited by examiner

*Primary Examiner*—Brian K. Talbot
(74) *Attorney, Agent, or Firm*—Richard J. Botos

(57) ABSTRACT

A process for the metalization of substrates is disclosed. The metal either forms a coating over the entire substrate, or it is patternwise deposited on the substrate surface. Metal is patternwise formed on the substrate either by forming a pattern of resist material on the substrate and depositing the material in the interstices defined by the pattern or by forming a patterned resist layer over a metal layer and transferring the pattern into the substrate using conventional techniques. The patterned resist layer is formed on the substrate using conventional techniques. The substrate is treated with reagents that promote the electroless plating of metal on the substrate surface. If the resist material has been previously formed on the substrate surface, the substrate surface is then dried. The remaining resist is then removed from the substrate surface. The substrate surface is then exposed to an electroless plating bath to form nickel onto those portions of the substrate surface that were treated with the sensitizing and activating solutions. The substrate is then heated to at least 180° C. Additional layers of metal are formed on the substrate. After the additional layers are so formed, the substrate is again heated to a temperature of at least about 180° C. after each layer is so formed.

21 Claims, 1 Drawing Sheet

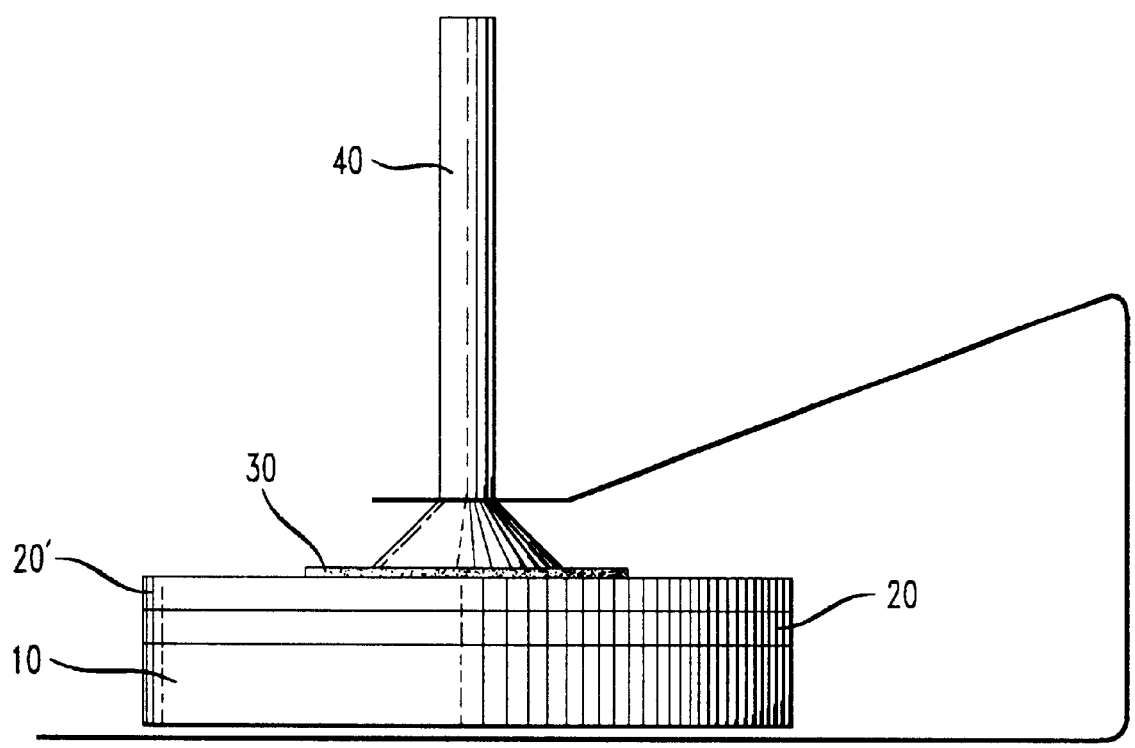

PROCESS FOR THE ELECTROLESS DEPOSITION OF METAL ON A SUBSTRATE

GOVERNMENT CONTRACT

This invention was made with Government support under Contract MDA972-94-C-0013. The government has certain rights in this invention.

TECHNICAL FIELD

A process for the selective deposition of metal on substrates is disclosed. The process is used to form wires or conducting lines on substrates in processes for fabricating printed circuits.

BACKGROUND OF THE INVENTION

Printed circuits are typically fabricated by plating conducting metal wires on substrates made of non-conducting material such as a ceramic substrates or on resistive metal films. The metal wires are formed on the substrate in a particular pattern. Typically, the pattern is either a pre-formed stencil mask, or is formed directly on the substrate in a layer of energy sensitive material using lithographic techniques. The pattern is used to form the metal on the substrate, either by transferring the pattern into a metal layer underlying the resist material or by depositing metal in the interstices of a pattern formed on the substrate.

The metal is formed on the substrate using techniques such as electroplating and electroless plating. In electroless metal plating, the substrate is immersed in an aqueous metal salt solution to plate metal on the substrate.

If electroless plating is used in a process for fabricating printed circuits, the metal formed on the substrate must adequately adhere to the substrate. Metal does not adequately adhere to the substrate if it becomes easily dislodged from the substrate either after being plated on the substrate or during subsequent processing of the printed circuit.

Adequate adhesion is demonstrated if the amount of pulling force necessary to separate the metal from the substrate is greater than 500 lb/in$^2$. Consequently, a process for fabricating printed circuits in which metal is deposited on a substrate such that the amount of pulling force needed to separate the metal from the substrate is at least about 500 lb/in$^2$ is desired.

SUMMARY OF THE INVENTION

A process for electrolessly forming metal on a substrates is disclosed. The amount of pulling force required to separate the substrate from the metal formed on the substrate by the present process is at least about 500 lb/in$^2$. Typically, the metal is electrolessly formed on a substrate that is either made of a ceramic material or a substrate over which is formed a layer of resistive material. The surface on which the metal is electrolessly formed is referred to generally herein as a substrate. If the substrate is made of a ceramic material, it is advantageous if the substrate is cleaned before metal is electrolessly formed thereon. The substrate is cleaned either by heating it to a temperature of about 800° C. to about 1500° C. or by contacting it with a solution of aqueous base that is heated to a temperature of about 25° C. to about 100° C. If the substrate has a layer of resistive material formed thereon, the substrate is cleaned prior to the formation of the resistive material layer on the substrate.

The substrate surface is then treated with reagents that promote the electroless plating of metal on the substrate surface. Conventional techniques, for example treating the substrate surface with a sensitizing solution such as tin fluoride ($SnF_2$) or tin chloride ($SnCl_2$) followed by an activating solution of palladium chloride ($PdCl_2$), are used for this purpose.

If the metal is to be formed in a pattern on the substrate, a layer of energy definable resist material is deposited on the substrate before it is treated with the sensitizing and activating solutions. A pattern is formed in the resist using conventional lithographic techniques. The pattern is developed, thereby exposing the portions of the substrate surface on which the metal is to be deposited in the desired pattern. When the substrate is then treated with the sensitizing and activating solutions, only the exposed portions of the substrate are contacted with these solutions. Consequently, the substrate surface is selectively sensitized in a pattern that corresponds to the resist pattern. The substrate with resist thereon is then dried using expedients such as baking the substrate at a temperature of at least about 100° C. The resist is then stripped from the substrate. In an alternate embodiment a second resist plating mask is then formed over the selectively sensitized substrate surface in the manner described above. Specifically, the mask is formed at least over substantially all of the unsensitized portions of the substrate surface.

The substrate is then subjected to an electroless metal plating bath. It is advantageous if the electroless plating bath contains nickel although other electroless metal plating baths such as cobalt phosphorous are also contemplated as suitable. If the substrate has a second resist plating mask formed thereon, the metal that is deposited is laterally confined by the plating mask.

After the substrate has been selectively plated with metal, the substrate is then heated to a temperature of about 180° C. to about 350° C. for an amount of time that is sufficient for the metal to adhere to the ceramic substrate. The amount of time depends upon the temperature, i.e. the higher the temperature, the shorter the time. For the temperature range specified, the amount of time varies from about 30 minutes to about 24 hours.

It is advantageous if a second layer of metal is deposited on the first metal (e.g. nickel) layer previously plated on the substrate. Typically these metals are deposited by electroless plating. Copper and palladium are examples of these metals. It is advantageous if nickel is electrolessly plated over the copper metal to protect it from oxidation.

The substrate is then baked at a temperature of about 180° C. to about 350° C. The substrate is then baked again at a temperature and for a time in the ranges specified above.

In an alternate embodiment, the fire-cleaned, ceramic substrate is first treated with the activating and sensitizing solutions as described above. A layer of nickel is then electrolessly plated thereon and the substrate is baked at a temperature of about 180° C. to about 350° C. A patterned layer of resist material is then formed on the metal layer using conventional materials and techniques. The patterned layer is transferred into the underlying metal layer using conventional expedients such as reactive ion etching and chemical etching. The remaining portion of the resist material is then removed from the substrate using conventional techniques. Optionally, a layer of copper is electrolessly formed on the patterned nickel layer as described above. The substrate is again baked at a temperature of about 180° C. to a temperature of about 350° C. after the copper layer is formed thereon.

BRIEF DESCRIPTION OF THE DRAWINGS

FIG. 1 is a schematic illustration of a layered device being tested to determine the adhesion between the layers of the device.

DETAILED DESCRIPTION

The present process contemplates either a coating of metal or a metal pattern on a substrate. The metal that is formed on the substrate according to the present process has very good adhesion, i.e., a pull strength of at least 500 lb/in$^2$ between the metal and the substrate.

Although the present process is useful for completely coating a substrate with metal, the present process is advantageously used to form metal patterns on the surface of substrates. The metal pattern is formed on the substrate by first forming a patterned mask on the substrate to which the metal is desired to conform. This mask is formed by using conventional techniques such as screen-printing or lithography. Methods for forming a mask on a substrate are well-known to those skilled in the art and will not be detailed herein.

Examples of suitable substrates include substrates made of ceramic materials. Furthermore, substrates over which a layer of a resistive material, e.g. tantalum (Ta), tantalum nitride (TaN), tantalum silicide (TaSi), and nickel chromium (NiCr), has been formed are also contemplated as suitable. It is advantageous if these metal layers have a thickness of about 5 to about 100 nm. The metal layers are formed on the substrates using conventional expedients, e.g. sputtering, which are well known to one skilled in the art.

Examples of ceramic substrate materials include: alumina ($Al_2O_3$) with a purity of at least about 75 to about 99.6 weight percent; metal substituted titanates such as barium titanate (e.g., $BaTi_4O_9$;$Ba_2Ti_9O_{20}$), zirconium tin titanate, zirconium barium titanate, and rare-earth titanate; and Beryllia (BeO.) These and other substrates are described in Licari, J., and Enlow, L., *Hybrid Microcircuit Technology Handbook*, pp. 25–43 (1988) and O'Bryan, H., Jr. and Thomson, J., Jr., "A New BaO—$TiO_2$ Compound with Temperature-Stable High Permittivity and Low Microwave Loss", *Journal of the American Ceramic Society*, 57(10): 450–453 (1974) which are incorporated by reference herein.

It is advantageous if the substrate is cleaned prior to metal or, if applicable, resistive material, being formed thereon. Ceramic substrates, for example, are fire cleaned by being heated to a temperature of about 800° C. to about 1500° C. and maintained at that temperature for about one minute to about 24 hours. If the substrate is alumina, it is advantageous if the temperature is about 1200° C. to about 1500° C. If the substrate is barium titanate, it is advantageous if the temperature is about 800° C. to about 1300° C.

Alternatively, the substrates are cleaned by contacting them with an aqueous base solution that is heated to a temperature of about 25° C. to about 100° C. One example of a suitable solution is an aqueous solution of sodium hydroxide. It is advantageous if the concentration of sodium hydroxide in the solution is about 23 g/l to about 75 g/l. The substrate is cleaned with the solution by conventional expedients such as rinsing or soaking. One skilled in the art will appreciate that the amount of time needed to clean a particular substrate will depend upon a number of factors including, but not limited to, the solution temperature, the concentration of base in the solution and the degree to which a particular substrate needs to be cleaned. In one embodiment the substrate is placed in an aqueous solution of sodium hydroxide (conc. of 50 g/l) at 25° C. for about 8 to about 12 hours. In another embodiment, the temperature of the solution is about 50° C. and the immersion time is about 2 to about 4 hours.

If the process is used to form a metal pattern on the substrate, such a pattern is then formed in an energy-definable resist material on the substrate thereby forming a mask thereon as previously described. The portions of the substrate surface that are exposed by the mask are those portions of the substrate surface on which the metal is to be deposited. The substrate surface is then treated with a reagent to promote the electroless plating of metal on the substrate surface. Techniques for so treating a substrate surface are described in H. Honma, et al. "Electroless Nickel Plating Of Alumina Ceramics", *Plating and Surface Finishing*, pp. 62–67 (Sep. 1987) which is hereby incorporated by reference.

It is advantageous if the substrate is treated with a sensitizing solution and an activating solution to promote the adhesion between the substrate surface and the metal that is electrolessly formed thereon. Typically, the sensitizing solution is tin chloride or tin fluoride. If the solution contains tin fluoride ($SnF_2$), it is advantageous if the solution is about 0.05 g/l to about 5 g/l in an aqueous solution. If the solution contains tin chloride ($SnCl_2$), it is advantageous if the solution is about 0.05 g/l to about 44 g/l in an aqueous solution of 0.1 M to about 1 M HCl. The temperature of these solutions is about 15° C. to about 90° C. It is advantageous if the temperature of the tin fluoride solution is about 25° C. and the temperature of the tin chloride solution is about 25° C. to about 50° C.

The substrate is then contacted with an activating solution of palladium chloride. The activating solution is a solution of palladium chloride ($PdCl_2$) in an aqueous HCl solution. It is advantageous if the solution is about 0.1 g/l to about 10 g/l $PdCl_2$ in about 0.01 to about 1 M HCl solution. The temperature of the $PdCl_2$ solution is about 15° C. to about 90° C., preferably about 50° C.

The substrate is kept in contact with the sensitizing and activating solutions for a time that is sufficient for the catalyst to bind to the desired portion of the substrate. Typically, this portion of the process is completed in two cycles. In the first cycle, the substrate is kept in contact with the sensitizing solution for about five minutes, rinsed, and then kept in contact with the activating solution for about five minutes. The substrate is then rinsed again, and the cycle is repeated, except the five minutes is reduced to two minutes. This is referred to as the "5522 Cycle".

If metal is to be formed in a pattern on the substrate, the substrate is then dried to anchor the palladium metal to the ceramic substrate. If this drying step is not performed, the catalyst will be stripped from the substrate when the photoresist is removed. Since this step is required to prevent the catalyst from being stripped when the photoresist is removed, such a step is not required if the entire substrate is coated with metal, or if the pattern is made of a material which is removed under conditions which will not remove the catalyst if this heating step is not performed.

The coated substrate is dried using conventional expedients such as vacuum drying or heat. If heat is used, the substrate is heated to a temperature of at least 100° C. for at least five minutes in order to accomplish this objective. It is advantageous if the substrate is heated to a temperature of about 150° C. for at least about 30 minutes. One skilled in the art will recognize that less heating time is required at higher temperatures. It is advantageous if the heating temperature does not exceed about 350° C. The mask for the pattern is then removed from the substrate using conventional techniques.

The substrate surface is then contacted with an electroless plating bath to plate metal on those areas of the substrate on which the sensitizing and activating materials are deposited.

It is advantageous if the electroless plating bath is a nickel bath. Electroless nickel baths are described in W. Riedel, "Electroless Nickel Plating", chap. 3 (ASM International 1991) which is hereby incorporated by reference. Other electroless metal plating baths such as cobalt/phosphorous and nickel/cobalt/phosphorous are also contemplated as suitable.

Electroless nickel plating baths are available commercially. An example of one such bath is a Nicklad 1000 bath that is obtained from the Kelite Division, Witco Chemical Co., Melrose Park, Ill. Electroless nickel plating baths such as the Nicklad 1000 bath typically contain phosphorous. It is advantageous if the phosphorous content of the electroless nickel bath is at least about eight atomic percent. The nickel is plated on the substrate by depositing the substrate in the nickel bath at an elevated temperature for an amount of time sufficient to plate the desired amount of metal on the substrate. For example, to deposit metal lines that are about 1 $\mu$m thick on a substrate, the substrate is deposited in a bath at a temperature of about 80° C. to about 95° C. for about 15 minutes. After the nickel is deposited, the substrate is again heated. The substrate is heated to a temperature of at least about 180° C. to achieve the desired adhesion in less than 24 hours. If the substrate is heated to about 250° C., the desired adhesion is obtained in about 60 minutes. It is advantageous if the substrate is not heated to a temperature that exceeds about 350° C.

It is contemplated that additional metal layers will be plated on to the first metal. Metals such as copper and palladium are examples of additional metals that are plated on the nickel metal layer in the present process. An additional layer of nickel is electrolessly plated over the copper to protect it from oxidation. These metals are electrolessly deposited in the present process. For example, if copper is deposited over the nickel deposited as described above, the substrate with the nickel formed thereon is placed in an electroless copper bath.

Electroless copper plating baths are commercially available. One example of a suitable bath is a MACu Dep 54 bath that is obtained from MacDermid Inc. of Waterbury, Conn. It is advantageous if copper is electrolessly plated in those applications where the electrical conductivity provided by nickel-phosphorus alloy is insufficient. To protect the copper from oxidation, another layer of nickel is electrolessly plated thereon. The nickel is electrolessly plated as described above.

After the copper and nickel have been plated on the nickel, the substrate is again heated to a temperature of at least 180° C. to effect the desired adhesion. Again, adhesion will be accomplished more quickly at higher temperatures; e.g., about one hour at 250° C. Consequently, in the process of the present invention the substrate is heated once after nickel has been electrolessly plated on the surface-catalyzed substrate, and once after additional metals have been plated on the nickel.

In an alternate embodiment, a second plating mask of a patterned resist is formed over the substrate after removing the layer of patterned resist that defined those areas of the substrate which were treated with the sensitizing and activating solutions. Typically, the second plating mask is formed over at least those portions of the substrate surface that were not contacted with the sensitizing and activating solutions. The second plating mask is formed and patterned using any of the materials and conditions previously described.

Metal is then plated on those portions of the treated substrate surface that are exposed through the mask. The mask provides lateral support for the metal plated on the substrate surface. The metal closely conforms to the pattern defined by the mask. After the metal is plated, the second plating mask is stripped from the substrate as described above.

EXAMPLE 1

An alumina (99.5% pure, 3.75"×4.5") substrate was baked at 120° C. for 30 minutes in a flowing nitrogen atmosphere (2 l/min) and was cleaned in an oxygen plasma (0.6 torr, 400 Watt) for 5 minutes. A mask was formed lithographically on the substrate. A Shipley photoresist, 4620, was spin-coated on the substrate at 2500 rpm for 40 seconds. The substrate was then baked at 100° C. for 90 seconds. The photoresist layer was then exposed for 25 seconds at 6.5 mW/cm$^2$ using a Karl Suss MA 56 exposure tool. The pattern was developed by immersing the substrate for 2 minutes in a developer solution of 2 parts water and one part of Shipley AZ400K. The substrate was then rinsed with deionized water for 4 minutes and blow-dried with nitrogen. The substrate was then baked at 120° C. for 1 hour in a flowing nitrogen atmosphere (2 l/min).

The substrate with the patterned mask was then dipped into an $SnF_2$/water solution (1 g/l) at 25° C. for 5 minutes, and rinsed in deionized water. The substrate was then dipped in a $PdCl_2$/water (0.6 g/L) and 0.03 M HCl solution at 50° C. for 5 minutes, and rinsed in deionized water. The process was then repeated except the substrate was held in the $SnF_2$ and $PdCl_2$ solutions for 2 minutes, ie., $SnF_2$ (2 min.)-rinse-$PdCl_2$ (2 min.)-rinse. The substrate was baked in air at 150° C. for 30 minutes. The photoresist layer was then stripped by immersing the substrate in a positive resist stripping solution (PRS-1000, J. T. Baker) at 90° C. for one minute.

The substrate with the catalyst pattern layer was immersed in an electroless nickel bath (Nicklad 1000, 71-100C, pH=4.5–5.5, Allied-Kelite Division, Witco Chemical Co., Melrose Park, Ill.) for 10 minutes. A pattern of nickel-phosphorus (Ni/P) metal was thereby formed on the substrate. The substrate was then rinsed in DI water.

The substrate was then heated to 250° C., after which the substrate was immersed in an electroless copper bath (MACuDep 54, MacDermid Inc., Waterbury, Conn.). The substrate was immersed in the bath for about 30 minutes, thereby depositing 1 $\mu$m of copper on the nickel previously deposited on the substrate. The substrates were then baked at a temperature of 250° C.

EXAMPLE 2

Four alumina (99.5% pure, 3.75"×4.5") substrates and four barium titanate substrates (3.75"×4.5") were baked and photoresist masks were formed thereon as described in Example 1.

The substrates were then dipped in solutions of $SnF_2$ and $PdCl_2$ (described in Example 1). The substrates were then baked at 150° C. for 30 minutes. Nickel was then electrolessly plated thereon as described in Example 1. Two of the alumina substrates and two of the barium titanate substrates were baked after the nickel was electrolessly plated thereon under the conditions described in Example 1. Two of each type of substrate were not baked following the electroless nickel plating step.

The substrates that were baked were immersed in a solution of $H_2SO_4$ (1.8M) for about one minute to remove the oxide therefrom. Both the baked and nonbaked substrates were immersed in an electroless copper bath (MACuDep54 described in Example 1) for about 30 minutes, thereby depositing about 1 μm of copper on the nickel layer previously deposited.

The substrates were immersed in a solution of dimethylamine borane (conc.~5g/l) for about five minutes. Nickel was then electrolessly plated for a second time on all eight substrates. Of the four substrates that were not baked after the first electroless plating step, one of each type was baked and one of each type was not. Of the four substrates that were baked after the first electroless plating step, one of each type was baked and one of each type was not.

The substrates were then subjected to a pulling force to demonstrate the effect that each of the intermediate baking steps has on the degree to which the metal adheres to the substrate. As illustrated in FIG. 1, a force bar 40 was affixed to the coated substrate 10 with epoxy cement 30. Force was then applied to the force bar 40 to demonstrate the adhesion of the first and second nickel (Ni) layers 20 to the substrate 10. The copper layer is not pictured. A Sebastian FIVE-A instrument, obtained from the Quad Group in Spokane, Washington, was used to determine the degree to which the nickel layer adhered to the substrate. Table 1 demonstrates that better adhesion was obtained when the substrate was baked after each electroless nickel plating step.

TABLE 1

| Substrate | Bake after 1st electroless Ni plating | Bake after 2nd electroless Ni plating | Pull Strength (kpsi) |
|---|---|---|---|
| Alumina | No | No | 0.32 |
| Alumina | No | Yes | 1.53 |
| Alumina | Yes | No | 1.70 |
| Alumina | Yes | Yes | 2.85 |
| Barium Titanate | No | No | 0.71 |
| Barium Titanate | No | Yes | 1.43 |
| Barium Titanate | Yes | No | 2.42 |
| Barium Titanate | Yes | Yes | 3.13 |

The measured pull strength was the average of the measured pull strength of at least seven samples.

EXAMPLE 3

Substantially improved adhesion was obtained when the substrates were fire cleaned prior to subsequent processing. Numerous barium titanate substrates of the size and type described in Example 2 were obtained. Approximately half of the substrates were annealed at 900° C. for about 4 hours.

The substrates were then immersed in solutions of $SnF_2$ and $PdCl_2$ the manner described in Example 1. Nickel was then electrolessly plated on the substrates and the substrates were baked again under the conditions described in Example 1.

The degree of adhesion between the nickel and the substrate was then measured as described in Example 2. Table 2 demonstrates that the nickel adhesion to the substrate was much stronger on the fire cleaned substrates, regardless of their source, than on the substrates that were not fire cleaned.

TABLE 2

| Fire Cleaned | | Not Fire Cleaned | | Fire Cleaned | | Not Fire Cleaned | |
|---|---|---|---|---|---|---|---|
| Pull Strength (kpsi) | Failure Interface | Pull Strength (kpsi) | Failure Interface | Pull Strength (kpsi) | Failure Interface | Pull Strength (kpsi) | Failure Interface |
| 5.92 | Ni/ceramic | 0.63 | Ni/ceramic | 4.09 | Ni/ceramic | 3.73 | Ni/ceramic |
| 4.85 | Ni/ceramic | 4.64 | Ni/ceramic | 7.03 | Ni/ceramic | 3.07 | Ni/ceramic |
| 2.43 | Ni/ceramic | 0.73 | Ni/ceramic | 4.66 | Ni/ceramic | 2.65 | Ni/ceramic |
| 2.75 | Ni/ceramic | 3.77 | Ni/ceramic | 5.5 | Ni/ceramic | 3.71 | Ni/ceramic |
| 5.93 | Ni/ceramic | 1.86 | Ni/ceramic | 6.37 | Ni/ceramic | 3.2 | Ni/ceramic |
| 7.02 | Ni/ceramic | 1.64 | Ni/ceramic | 5.62 | Ni/ceramic | 1.93 | Ni/ceramic |
| 1.18 | Ni/ceramic | 0.73 | Ni/ceramic | 4.67 | Ni/ceramic | 4.48 | Ni/ceramic |
| 7.63 | Ni/ceramic | 1.50 | Ni/ceramic | 6.05 | Ni/ceramic | 1.84 | Ni/ceramic |
| 7.44 | Ni/ceramic | 5 | Ni/ceramic | 8.22 | Ni/ceramic | 2.16 | Ni/ceramic |
| | | 3.24 | Ni/ceramic | 8.47 | Ni/ceramic | 1.21 | Ni/ceramic |

| | Fire Cleaned | Not Fire Cleaned |
|---|---|---|
| Avg. Pull Strength | 5.57 | 2.59 |

What is claimed is:

1. A method for forming a metallic coating on a surface of a substrate, comprising the steps of:
    applying a layer of energy definable resist material on a ceramic substrate;
    patterning the resist layer such that a first portion of the substrate surface is covered by the resist layer and a second portion of the substrate surface is not covered by the resist layer;
    treating the second portion of the surface with a reagent to promote the electroless plating of metal onto the substrate;
    drying the surface of the substrate after treating the surface;
    removing the resist layer;
    exposing the surface to an electroless metal plating bath such that metal is formed on the surface; and
    heating the surface of the substrate to about 180° C. to about 350° C. for a time sufficient for the metal to adhere to the substrate.

2. The method of claim 1 wherein the metal is nickel.

3. The method of claim 1, wherein the substrate is a ceramic material selected from the group consisting of alumina, barium titanate, beryllia, zirconium tin titanate, zirconium barium titanate and rare earth titanate.

4. The method of claim 1, wherein the substrate surface has a layer of resistive material selected from the group consisting of tantalum, tantalum nitride, tantalum silicide, and nickel chromium formed thereon.

5. The method of claim 2, further comprising exposing the surface to a second metal electroless plating bath after the nickel is electrolessly plated thereon, resulting in the formation of a second metal pattern on the nickel pattern; and heating the surface of the substrate to a temperature of about 180° C. to about 350° C.

6. The method of claim 5, wherein the second metal is selected from the group consisting of copper and palladium.

7. The method of claim 3, further comprising fire cleaning the substrate at a temperature of about 800° C. to about 1500° C. before applying the resist layer thereon.

8. The method of claim 1, further comprising cleaning the substrate by contacting the substrate with a solution of aqueous base before the resist material is applied onto the substrate.

9. The method of claim 5, further comprising fire cleaning the substrate at a temperature of about 800° C. to about 1500° C. before the resist material is applied onto the substrate.

10. The method of claim 1, further comprising applying a second resist layer and patterning the resist such that the patterned resist substantially masks at least those areas of the substrate which were not exposed to the reagent prior to electrolessly plating metal onto the substrate, and removing the resist mask after the substrate has been heated following the formation of metal thereon.

11. The method of claim 6, further comprising applying a second resist layer and patterning the resist such that the pattern resist substantially masks at least those areas of the substrate which were not exposed to the reagent prior to electrolessly plating nickel and copper onto the substrate, and removing the resist mask after the substrate has been heated following the deposition of nickel and copper thereon.

12. The method of claim 5, further comprising applying a second resist layer and patterning the resist such that the patterned resist substantially masks at least those areas of the substrate which were not exposed to the reagent prior to electrolessly plating nickel onto the substrate, and removing the resist after the substrate has been heated following the formation of metal thereon.

13. A method for forming a metallic coating on a surface of a substrate, comprising the steps of:

fire-cleaning a substrate at a temperature of about 800° C. to about 1500° C.;

treating the surface of a ceramic substrate with a sensitizing solution comprising a salt of tin selected from the group consisting of $SnF_2$ and $SnCl_2$ and an activating solution that comprises $PdCl_2$;

subjecting the surface to an electroless metal plating bath such that a metal layer is formed on the surface; and heating the surface of the substrate to a temperature of about 180° C. to about 350° C.

14. The method of claim 13 wherein the electroless metal plating bath is an electroless nickel plating bath.

15. The method of claim 14 further comprising subjecting the surface to a copper or palladium electroless plating bath such that a copper or palladium layer is formed on the nickel layer.

16. The method of claim 15, further comprising heating the surface of the substrate to a temperature of about 180° C. to about 350° C. once before the copper is formed on the substrate and once after the copper is formed on the substrate.

17. The method of claim 13, wherein the substrate is a ceramic material selected from the group consisting of alumina, barium titanate, beryllia, zirconium tin titanate, zirconium barium titanate and rare-earth barium titanates.

18. The method of claim 13, wherein the metal coating so formed is a patterned metal coating, the method further comprising: forming the pattern in a resist material overlying the substrate prior to treating the substrate with the activating and sensitizing solutions; drying the treated substrate surface after treating the substrate with the sensitizing solution and the activating solution; and removing the remaining portion of the resist layer from the substrate.

19. The method of claim 14, further comprising: forming a patterned layer of resist material over the nickel layer; transferring the pattern into the nickel layer; and removing the remaining portion of the resist material from the nickel layer.

20. The method of claim 15, further comprising forming a patterned layer of resist material over the copper layer, transferring the pattern into the copper layer and removing the remaining portion of the resist material from the copper layer.

21. The method of claim 13, wherein a layer of resistive material is formed on the substrate surface after the substrate is fire cleaned, wherein the resistive material is selected from the group consisting of tantalum, tantalum nitride, tantalum silicide, and nickel chromium.

* * * * *